(12) United States Patent
Chen

(10) Patent No.: US 8,107,283 B2
(45) Date of Patent: Jan. 31, 2012

(54) METHOD FOR SETTING PCRAM DEVICES

(75) Inventor: Yi-Chou Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 158 days.

(21) Appl. No.: 12/352,534

(22) Filed: Jan. 12, 2009

(65) Prior Publication Data

US 2010/0177559 A1    Jul. 15, 2010

(51) Int. Cl.
*G11C 11/00* (2006.01)

(52) U.S. Cl. .......................................... 365/163; 365/148

(58) Field of Classification Search .................. None
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii et al. |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |

(Continued)

FOREIGN PATENT DOCUMENTS

KR    1020050005444    *    1/2005

OTHER PUBLICATIONS

"Magnetic Bit Boost," www.sciencenews.org, Dec. 18 & 25, 2004, p. 389, vol. 166.

(Continued)

*Primary Examiner* — Hoai V Ho
*Assistant Examiner* — James G Norman
(74) *Attorney, Agent, or Firm* — Haynes Beffel & Wolfeld LLP

(57) ABSTRACT

Memory devices and methods for operating such devices are described herein. A method as described herein includes applying a bias arrangement to a memory cell to change the resistance state from a higher resistance state to a lower resistance state. The bias arrangement comprises a first voltage pulse and a second voltage pulse across the phase change memory element, the second voltage pulse having a voltage polarity different from that of the first voltage pulse.

22 Claims, 19 Drawing Sheets

U.S. PATENT DOCUMENTS

| | | |
|---|---|---|
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,085,154 B2 | 8/2006 | Cho et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,126,847 B2 | 10/2006 | Ha et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,158,411 B2 | 1/2007 | Yeh et al. |
| 7,164,147 B2 | 1/2007 | Lee et al. |
| 7,166,533 B2 | 1/2007 | Happ |
| 7,169,635 B2 | 1/2007 | Kozicki |
| 7,190,607 B2 | 3/2007 | Cho et al. |
| 7,202,493 B2 | 4/2007 | Lung et al. |
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |

| Patent/Pub No. | Date | Inventor |
|---|---|---|
| 7,254,059 B2 | 8/2007 | Li et al. |
| 7,269,052 B2 | 9/2007 | Segal et al. |
| 7,277,317 B2 | 10/2007 | Le Phan et al. |
| 7,291,556 B2 | 11/2007 | Choi et al. |
| 7,309,630 B2 | 12/2007 | Fan et al. |
| 7,321,130 B2 | 1/2008 | Lung et al. |
| 7,323,708 B2 | 1/2008 | Lee et al. |
| 7,323,734 B2 | 1/2008 | Ha et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,385,235 B2 | 6/2008 | Lung et al. |
| 7,388,273 B2 | 6/2008 | Burr et al. |
| 7,394,088 B2 | 7/2008 | Lung |
| 7,397,060 B2 | 7/2008 | Lung |
| 7,400,522 B2 | 7/2008 | Toda et al. |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 7,473,576 B2 | 1/2009 | Lung |
| 7,479,649 B2 | 1/2009 | Lung |
| 7,485,891 B2 | 2/2009 | Hamann et al. |
| 7,502,252 B2 | 3/2009 | Fuji et al. |
| 7,505,330 B2 | 3/2009 | Pawlowski et al. |
| 7,507,986 B2 | 3/2009 | Lung |
| 7,514,334 B2 | 4/2009 | Chen et al. |
| 7,514,705 B2 | 4/2009 | Breitwisch et al. |
| 7,515,461 B2 | 4/2009 | Happ et al. |
| 2002/0070457 A1 | 6/2002 | Sun et al. |
| 2002/0113273 A1 | 8/2002 | Hwang et al. |
| 2003/0072195 A1 | 4/2003 | Mikolajick |
| 2003/0095426 A1 | 5/2003 | Hush et al. |
| 2003/0186481 A1 | 10/2003 | Lung |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0052904 A1 | 3/2005 | Cho et al. |
| 2005/0062087 A1 | 3/2005 | Chen et al. |
| 2005/0093022 A1 | 5/2005 | Lung |
| 2005/0127349 A1 | 6/2005 | Horak et al. |
| 2005/0141261 A1 | 6/2005 | Ahn |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0195633 A1 | 9/2005 | Choi et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2006/0006472 A1 | 1/2006 | Jiang |
| 2006/0034112 A1 | 2/2006 | Oh et al. |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157681 A1 | 7/2006 | Chen et al. |
| 2006/0160307 A1* | 7/2006 | Joo et al. ........................ 438/261 |
| 2006/0163554 A1 | 7/2006 | Lankhorst et al. |
| 2006/0172067 A1 | 8/2006 | Ovshinsky et al. |
| 2006/0175599 A1 | 8/2006 | Happ |
| 2006/0198183 A1 | 9/2006 | Kawahara et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0250885 A1 | 11/2006 | Cho et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289847 A1 | 12/2006 | Dodge |
| 2006/0289848 A1 | 12/2006 | Dennison |
| 2007/0007613 A1 | 1/2007 | Wang et al. |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0040159 A1 | 2/2007 | Wang |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0140029 A1 | 6/2007 | Kim et al. |
| 2007/0147105 A1 | 6/2007 | Lung et al. |
| 2007/0153563 A1 | 7/2007 | Nirschl |
| 2007/0153570 A1* | 7/2007 | Suh ........................ 365/163 |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |

| | | | |
|---|---|---|---|
| 2008/0043520 A1 | 2/2008 | Chen | |
| 2008/0094871 A1 | 4/2008 | Parkinson | |
| 2008/0101110 A1 | 5/2008 | Happ et al. | |
| 2008/0137400 A1 | 6/2008 | Chen et al. | |
| 2008/0137504 A1* | 6/2008 | Meinders et al. | 369/59.12 |
| 2008/0138929 A1 | 6/2008 | Lung | |
| 2008/0138930 A1 | 6/2008 | Lung | |
| 2008/0138931 A1 | 6/2008 | Lung | |
| 2008/0164453 A1 | 7/2008 | Breitwisch et al. | |
| 2008/0165569 A1 | 7/2008 | Chen et al. | |
| 2008/0165570 A1 | 7/2008 | Happ et al. | |
| 2008/0165572 A1 | 7/2008 | Lung | |
| 2008/0166875 A1 | 7/2008 | Lung | |
| 2008/0179582 A1 | 7/2008 | Burr et al. | |
| 2008/0180990 A1 | 7/2008 | Lung | |
| 2008/0186755 A1 | 8/2008 | Lung et al. | |
| 2008/0191187 A1 | 8/2008 | Lung et al. | |
| 2008/0192534 A1 | 8/2008 | Lung | |
| 2008/0197334 A1 | 8/2008 | Lung | |
| 2008/0224119 A1 | 9/2008 | Burr et al. | |
| 2008/0225489 A1 | 9/2008 | Cai et al. | |
| 2008/0265234 A1 | 10/2008 | Breitwisch et al. | |
| 2009/0001341 A1 | 1/2009 | Breitwisch et al. | |
| 2009/0014704 A1 | 1/2009 | Chen et al. | |
| 2009/0023242 A1 | 1/2009 | Lung | |
| 2009/0027950 A1 | 1/2009 | Lam et al. | |
| 2009/0042335 A1 | 2/2009 | Lung | |
| 2009/0057641 A1 | 3/2009 | Lung | |
| 2009/0098678 A1 | 4/2009 | Lung | |
| 2009/0148980 A1* | 6/2009 | Yu | 438/102 |
| 2009/0168504 A1* | 7/2009 | Lee et al. | 365/163 |
| 2009/0273968 A1 | 11/2009 | Lamorey et al. | |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, published in 1997, pp. 1-6.

Bedeschi, F. et al., "4-MB MOSFET-Selected Phase-Change Memory Experimental Chip," IEEE, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Gleixner, "Phase Change Memory Reliability", 22nd NVSMW, Aug. 26, 2007, 46 pages.

Ha, Y. H. et al., "An Edge Contact Type Cell for Phase Change RAM Featuring Very Low Power Consumption," 2003 Symposium on VLSI Technology Digest of Technical Papers, pp. 175-176.

Hanzawa, Satoru, et al., "A 512kB Embedded Phase Change Memory with 416kB/s Write Throughput at 100µA Cell Write Current," ISSCC 2007, Session 26, Non-Volatile Memories/26.2, 3 pages.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM 2004, 4 pp.

Lai, Stefan, "Current Status of the Phase Change Memory and its Future," IEEE IEDM 2003, pp. 255-258.

Lai, Stephan et al., "OUM-A 180 nm Nonvolatile Memory Cell Element Technology for Stand Alone and Embedded Applications," IEEE IEDM 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Oh, Hyung-Rok, et al., "Enhanced Write Performance of a 64Mb Phase-change Random Access Memory," 2005 IEEE International Solid-State Circuits Conference, Session 2, Non-Volatile Memory, 2.3, 3 pages.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20 high%20density%20high%20performance%20phase% 20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

Shown in the SEM: Width =25nm, Thickness=5nm, length=50nm

Devices we have: Width =25/45/90 nm, Thickness=5nm, length=50nm & up

W/H/L=45nm/5nm/70nm SiO2-GST    RESET 8.5V 80ns    SET 7V/200ns + -4.9V 200ns

METHOD FOR SETTING PCRAM DEVICES

PARTIES TO A JOINT RESEARCH AGREEMENT

International Business Machines Corporation, a New York corporation, Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to memory devices based on phase change based memory materials, including chalcogenide based materials and on other programmable resistive materials, and methods for operating such devices.

2. Description of Related Art

Phase change based memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

In phase change memory, data is stored by causing transitions in an active region of the phase change material between amorphous and crystalline phases. FIG. 1 is an example distribution of the resistance for a number of memory cells each comprising a phase change memory element. The phase change memory elements of the memory cells are programmable to a plurality of resistance states including a high resistance reset (erased) state 102 and at least one lower resistance programmed (set) state 100. Each resistance state corresponds to a non-overlapping resistance range.

The difference between the highest resistance $R_1$ of the lower resistance state 100 and the lowest resistance $R_2$ of the high resistance reset state 102 defines a read margin 101 used to distinguish cells in the lower resistance state 100 from those in the high resistance state 102. The data stored in a memory cell can be determined by determining whether the memory cell has a resistance corresponding to the lower resistance state 100 or to the high resistance state 102, for example by measuring whether the resistance of the memory cell is above or below a threshold resistance value $R_{SA}$ 103 within the read margin 101.

The change from the high resistance state 102 to the lower resistance state 100, referred to as set (or program) herein, is generally a lower current operation in which current heats the phase change material above a transition temperature to cause transition from the amorphous to the crystalline phase. The change from lower resistance state 100 to the high resistance state 102, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous phase.

The magnitude of the current needed for reset can be reduced by reducing the size of the phase change memory element so that higher current densities are achieved with small absolute current values through the phase change memory element. However, reducing the size of the phase change memory element can result in a "difficult to set" phenomenon. Specifically, it can be become difficult to cause an active region of the phase change material to transition from the amorphous phase of the high resistance state 102 to the crystalline phase of the lower resistance state 100. The reasons for this behavior are not well understood.

It is therefore desirable to provide methods for operating memory devices characterized by the difficult to set behavior.

SUMMARY OF THE INVENTION

A method is described herein for operating a memory cell comprising a phase change memory element programmable to a plurality of resistance states including a higher resistance state and a lower resistance state. The method comprises applying a bias arrangement to the memory cell to change the resistance state from the higher resistance state to the lower resistance state. The bias arrangement comprises a first voltage pulse and a second voltage pulse across the phase change memory element, the second voltage pulse having a voltage polarity different from that of the first voltage pulse.

A memory device as described herein comprises a memory cell comprising a phase change memory element programmable to a plurality of resistance states including a higher resistance state and a lower resistance state. The memory device further comprises bias circuitry to apply a bias arrangement as described above.

The set operations described herein comprising first and second voltage pulses of different polarity are shown to overcome the "difficult to set" behavior memory cell structures which suffer significant thermo-electric effects that cause asymmetrical heating in the body of the phase change material, such as small bridge type memory cells. Representative configurations suffering this "difficult to set" behavior have a relatively long current path through the phase change material and a cross-sectional area that is small relative to the current path length. Representative configurations also have an active region with a heating zone during a set operation which is spaced away from electrodes contacting the phase change material.

Bridge cells having a thickness between about 3 and 20 nm and pillar cells having diameters between about 3 nm and 20 nm are typical structures to which the set operation described herein can be applied. In particular, these "difficult to set" memory cells include phase change materials such as $Ge_xSb_yTe_z$ and $Ge_xTe_y$ which transition to the set state in a nucleation dominated mode.

Other aspects and advantages of the present invention can be seen on review of the drawings, the detailed description, and the claims which follow.

DETAILED DESCRIPTION

Figure 1:
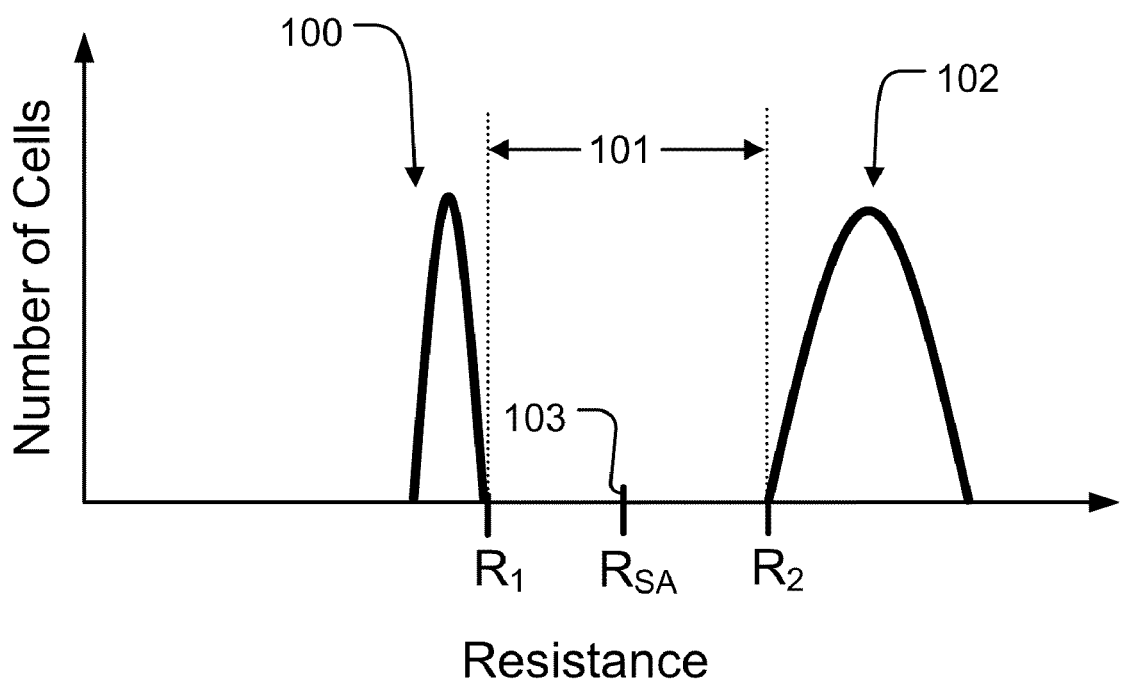
FIG. 1 is an example distribution of the resistance of a number of memory cells each comprising a phase change memory element programmable to a high resistance state and a low resistance state.

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

As mentioned above, as the size of the phase change memory element is reduced it becomes more and more difficult to cause a transition to the lower resistance state 100.

FIGS. 2A-2D show prior art memory cell structures for which the set operation described herein can be applied to overcome the "difficult to set" characteristic of very small devices.

Figure 2A:
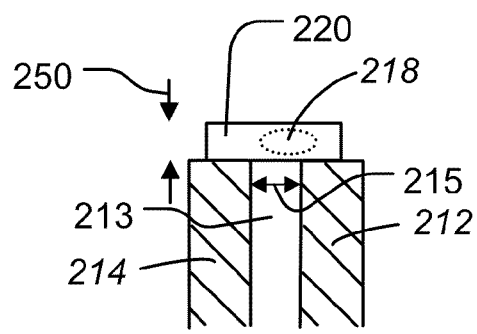
FIGS. 2A-2D show prior art memory cell structures for which the set operation described herein can be applied to overcome the "difficult to set" behavior of very small devices.

FIG. 2A is a simplified cross-sectional view of a memory cell 200 illustrating a first configuration for memory element 220 coupled to first and second electrodes 212, 214. The first electrode 212 may, for example, be coupled to a terminal of an access device such as a diode or transistor, while the second electrode 214 may be coupled to a bit line.

A dielectric spacer 213 having a width 215 separates the first and second electrodes 212, 214. The phase change material of memory element 220 has a thickness 250 and extends across the dielectric spacer 213 to contacts the first and second electrodes 212, 214, thereby defining an inter-electrode path between the first and second electrodes 212, 214 having a path length defined by the width 215 of the dielectric spacer 213. In operation, as current passes between the first and second electrodes 212, 214 and through the memory element 220, the active region 218 of the phase change material of the memory element 220 heats up more quickly than the remainder of the memory element 220.

Figure 2B:
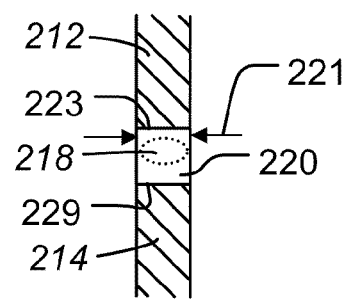

FIG. 2B is a simplified cross-sectional view illustrating a second configuration for memory element 220 coupled to first and second electrodes 212, 214. The phase change material of the memory element 220 has an active region 218 and contacts the first and second electrodes 212, 214 at top and bottom surfaces 223, 229 respectively. The memory element 220 has a width (which in some embodiments is a diameter) 221 the same as that of the first and second electrodes 212, 214.

Figure 2C:
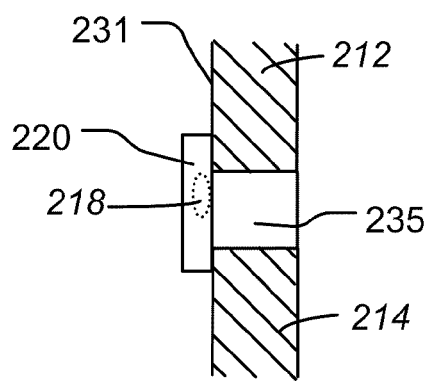

FIG. 2C is a simplified cross-sectional view illustrating a third configuration for memory element 220 coupled to first and second electrodes 212, 214, the phase change material of memory element 220 having an active region 218. The first and second electrodes 212, 214 are separated by dielectric spacer 235. The first and second electrodes 212, 214 and the dielectric spacer 235 have a sidewall surface 231. The phase change material of memory element 220 is on the sidewall surface 231 and extends across the dielectric spacer 235 to contact the first and second electrodes 212, 214.

Figure 2D:
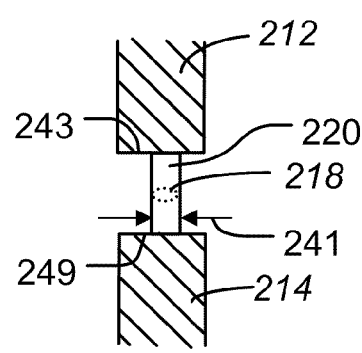

FIG. 2D is a simplified cross-sectional view illustrating a fourth configuration for memory element 220 coupled to first and second electrodes 212, 214. The phase change material of memory element 220 has an active region 218 and contacts the first and second electrodes 212, 214 at top and bottom surfaces 243, 249 respectively. The memory element 220 has a width (which in some embodiments is a diameter) 241 less than that of the first and second electrodes 212, 214.

Reading or writing to the memory cell 200 can be achieved by applying appropriate bias arrangements across the memory element 220 by applying pulses to one or both of the first and second electrodes 212, 214 to induce current through the memory element 220. The levels and durations of the pulses applied are dependent upon the operation performed (e.g. a read operation or a programming operation) and can be determined empirically for each embodiment. The bias arrangements may include pulses having a positive voltage from the second electrode 214 to the first electrode 212 (referred to herein as a positive voltage across the memory element 220), and/or may include pulses having a negative voltage from the second electrode 214 to the first electrode 212 (referred to herein as a negative voltage across the memory element 220).

Figure 13:
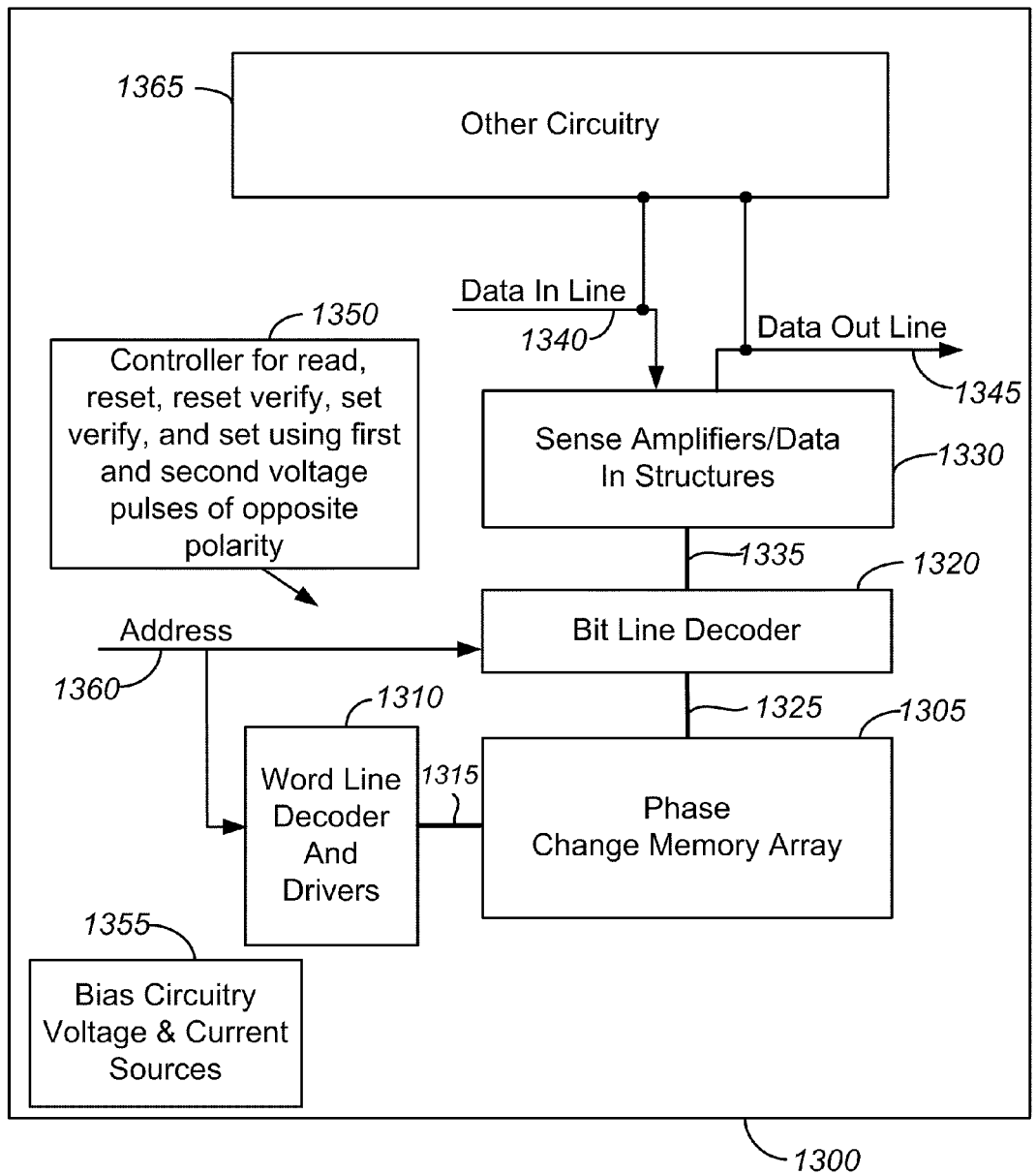
FIG. 13 is a simplified block diagram of an integrated circuit in which the set operations described herein can be implemented.

In a read (or sense) operation of the memory cell 200, bias circuitry (See, for example, bias circuitry voltage & current sources 1355 of FIG. 13) coupled to the first and second electrodes 212, 214 applies a read bias arrangement across the memory element 220 of suitable amplitude and duration to induce current to flow which does not result in the memory element 220 undergoing a change in resistive state. The current through the memory element 220 is dependent upon the resistance of the memory element 220 and thus the data value stored in the memory cell 200.

In a reset operation of the memory cell 200, bias circuitry (See, for example, bias circuitry voltage & current sources 1355 of FIG. 13) coupled to the first and second electrodes 212, 214 applies a reset bias arrangement of suitable amplitude and duration to induce a current to flow through the memory element 220, thereby raising the temperature of at least the active region above the transition (crystallization) temperature of the phase change material of the memory element 220 and also above the melting temperature to place at least the active region 218 in a liquid state. The current is then terminated, for example by terminating voltage pulses applied to the first and second electrodes 212, 214, resulting in a relatively quick quenching time as the active region 218 rapidly cools to stabilize to an amorphous phase.

As the size of the phase change memory element 220 is reduced it becomes more and more difficult to cause the active region 218 to transition from the amorphous phase of the high resistance state to the crystalline phase of the lower resistance state. As discussed below with reference to FIG. 3, it is theorized that the "difficult to set" behavior is due to significant thermo-electric effects such as the Thomson effect which result in asymmetric heating of the phase change material.

Figure 3:
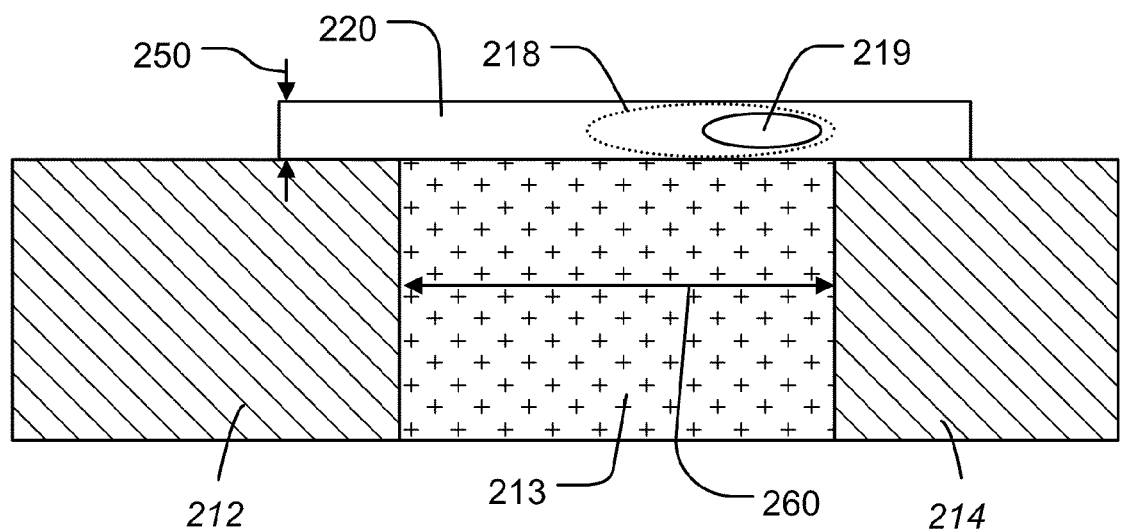
FIG. 3 is a cross-sectional view of a bridge type memory cell having asymmetric heating along the current path through the memory element.

Illustrated in FIG. 3 is a bridge type memory cell 300 having first and second electrodes 212, 214 and a phase change memory element 220 extending across a dielectric spacer 213 to contact the electrodes 212, 214. The phase change memory element 220 defines an inter-electrode path between the first and second electrodes having an inter-electrode path length defined by the width 260 of the dielectric spacer 213. In operation, asymmetric heating along the current path between the electrodes 212, 214 results in an amorphous active region 218 in the higher resistance reset state that is closer to one electrode 214 than the other electrode 212.

During a set operation, heating takes place within the amorphous active region 218 since the resistance in the amorphous phase is higher than that in the crystalline phase. Due to the asymmetric heating, applying a set pulse of the same voltage polarity as a reset pulse results in an asymmetric heating zone 219 where heating takes place within the amorphous active region 218. As shown in FIG. 3, the heating zone 219 is closer to the second electrode 214.

The relatively high thermal conductivity of the electrode 214 acts to draw heat away from the heating zone 219 of the active region 218, resulting in a significant amount of heat loss during a set operation. The asymmetric heating zone 219 and high heat loss results in insufficient heating to cause a transition of the active region 218 into the low resistance crystalline phase, resulting in the "difficult to set" behavior.

Figure 4:
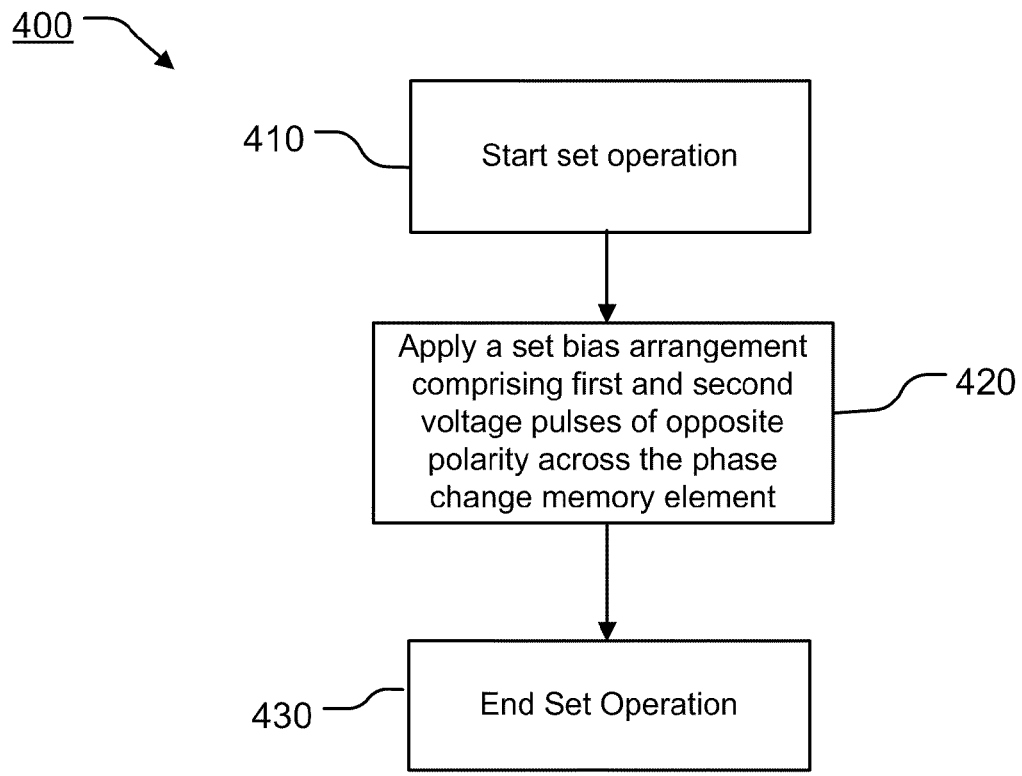
FIG. 4 is a flow diagram of set operation which can overcome the difficult to set behavior of programming a memory element from the higher resistance reset state to the lower resistance state.
Figure 5:
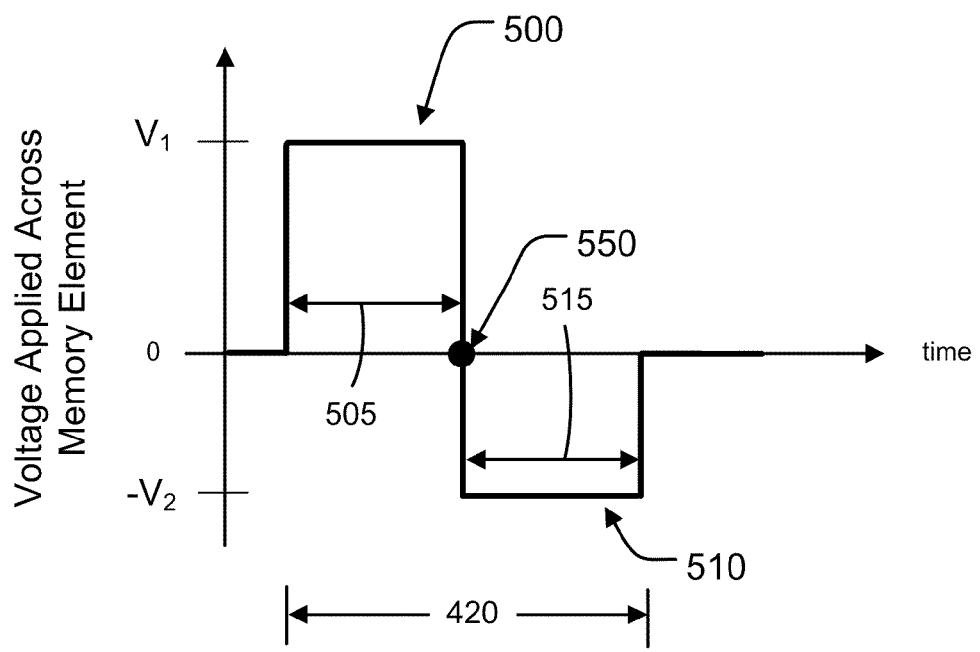
FIG. 5 is a first embodiment of a timing diagram of the set operation of FIG. 4.

FIG. 4 is a flow diagram of a set operation 400 which can overcome the "difficult to set" characteristic of programming the memory element 220 from the higher resistance reset state 102 to the lower resistance state 100. FIG. 5 illustrates a first embodiment of a timing diagram of the set operation 400 of FIG. 4. As will be understood the timing diagram of FIG. 5 is simplified and not necessarily to scale.

The set operation 400 of the memory cell 200 begins at step 410. Step 410 may include, or in some embodiments be preceded by, a read operation to determine if the memory cell 200 needs to be programmed by the set operation 400.

Next, at step 420 a set bias arrangement comprising first and second voltage pulses of different polarity across the memory element 220 is applied to the memory cell 200. As described in more detail below, the set bias arrangement induces first and second currents of opposite direction though the memory element 220 to change the resistance state from the higher resistance state to the lower resistance state. The first and second voltage pulses can be applied by applying pulses to one or both of the first and second electrodes 212, 214.

In the illustrated embodiment of FIG. 5, the set bias arrangement of step 420 comprises first voltage pulse 500 across the memory element 220 and second voltage pulse 510 across the memory element 220. The first voltage pulse 500 has a pulse height $V_1$ and a pulse width 505, and the second voltage pulse 510 has a pulse height of $V_2$ and a pulse width 515. The pulse heights and pulse widths of the voltage pulses can be determined empirically for each embodiment. In embodiments the ratio of the pulse heights $V_2/V_1$ can be less than or equal to one, for example being between 0.5 and 1. Additionally, in some embodiments the pulse widths 505 and 515 are the same. In embodiments the pulse height $V_2$ of the second voltage pulse 510 can be less than the threshold voltage $V_{th}$ of the memory element 220. The threshold voltage is a voltage level across the memory element 220 above which a transition begins from the higher resistance state to the lower resistance state. Because the memory cell undergoes a phase change as a result of heating of the phase change material of the memory element 220, it will be understood that the threshold voltage $V_{th}$ is dependent upon the implementation of the memory cell including the memory cell structure, the thermal and electrical properties of the materials of the memory cell including the phase change material, and the pulse shape of the applied energy. The threshold voltage $V_{th}$ can be determined empirically for each embodiment.

The first voltage pulse 500 induces current to flow from the second electrode 214 through the memory element 220 to the first electrode 212. The second voltage pulse 510 induces current to flow from the first electrode 212 through the memory element 220 to the second electrode 214. Since current flows in both directions, the bipolar set operation can compensate for the asymmetrical heating of the active region caused by thermal-electric effects such as the Thomson effect.

For example, the first voltage pulse 500 inducing a current from the second electrode 214 to the first electrode 212 resulting in a first heating zone within the active region 218 which is closer to the second electrode 214. The first heating zone can cause a transition of a portion of the active region 218 into the crystalline phase. The second voltage pulse 510 of different voltage polarity can result in a second heating zone within the active region 218 which is farther away from the second electrode 214 and closer to the first electrode 212 than the first heating zone. The second heating zone can cause a transition of the remaining portion of the active region 218. The second heating zone may be separated from or adjacent to the first heating zone, and results in more efficient crystallization of the active region 218 to provide a lower resistance current path through the active region 218. Thus, the currents induced by the first and second voltage pulses 500, 510 are sufficient to raise the temperature of the active region 218 above the transition (crystallization) temperature of the phase change material to cause a transition of the active region 218 into a crystalline phase, thereby establishing the lower resistance state.

In the illustrated embodiment of FIGS. 4 and 5 the set bias arrangement of step 420 consists of two voltage pulses. In alternative embodiments the set bias arrangement of step 420 may comprise additional voltage pulses in addition to the first and second voltage pulses 500, 510.

Figure 6:
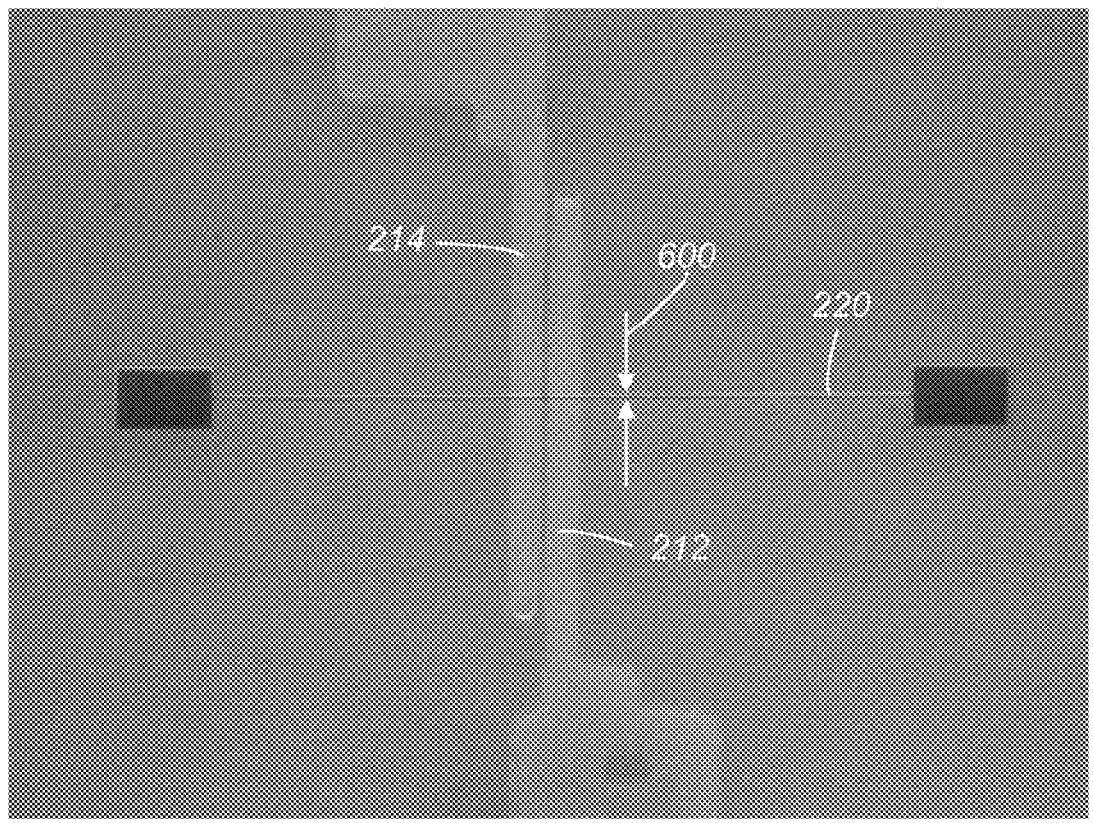
FIG. 6 is an SEM image of a top view of a bridge type memory cell.

FIG. 6 is an SEM image of a top view of a bridge type memory cell comprising $Ge_2Sb_2Te_5$ doped with about 8 at % silicon dioxide. In FIG. 6, the memory cell has a length between electrodes 212 and 214 of 50 nm, and the memory element 220 has a width 221 of 25 nm and a thickness of 5 nm. In the measured results presented herein, bridge type memory cells having widths of 25/45/90 nm, thicknesses of 5 nm, and lengths of 50 nm and up were built and tested.

Figure 7:
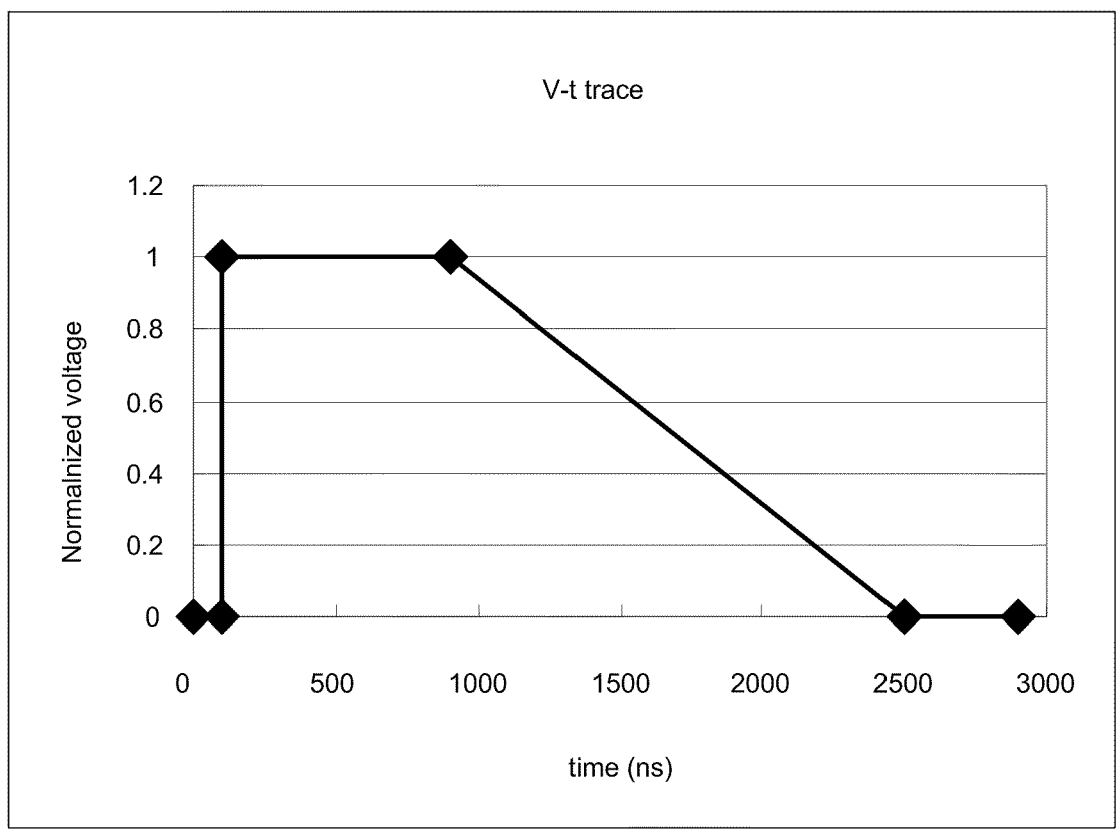
FIG. 7 is a timing diagram of a single polarity set operation unable to set the device of FIG. 6.

Measurements of the memory cell of FIG. 6 indicate it cannot be set to the lower resistance state using a single polarity set operation and thus is characterized as being "difficult to set". For example, a 800 ns voltage pulse with a maximum voltage of 10.5 V and a 1600 ns tail of the simplified timing diagram of FIG. 7 was unable to set the device having memory element with a width of 45 nm, a thickness of 5 nm, and a length of 60 nm.

Figure 8A:
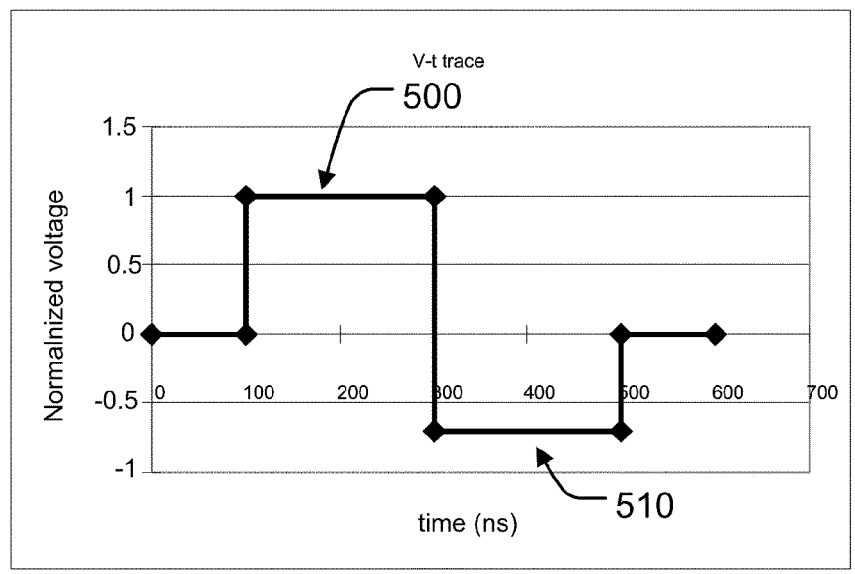
FIG. 8A is a simplified timing diagram of the set operation which overcomes the difficult to set operation of the memory cell of FIG. 6.

FIG. 8A is a simplified timing diagram of the set operation described herein of using first and second voltage pulses of different polarity which overcomes the "difficult to set" characteristic of the memory cell of FIG. 6. In FIG. 8A the first voltage pulse 500 has a pulse height of 7 V and a pulse width of 200 ns, and the second voltage pulse 510 has a pulse height of 4.9V and a pulse width of 200 ns. The rise and fall times of the pulses of FIG. 8A are preferably as short as possible, and in one embodiment are about 2.5 ns. As can be seen in FIG. 8A the second voltage pulse 510 has a voltage polarity across the memory element different from that of the first voltage pulse 500.

Figure 8B:
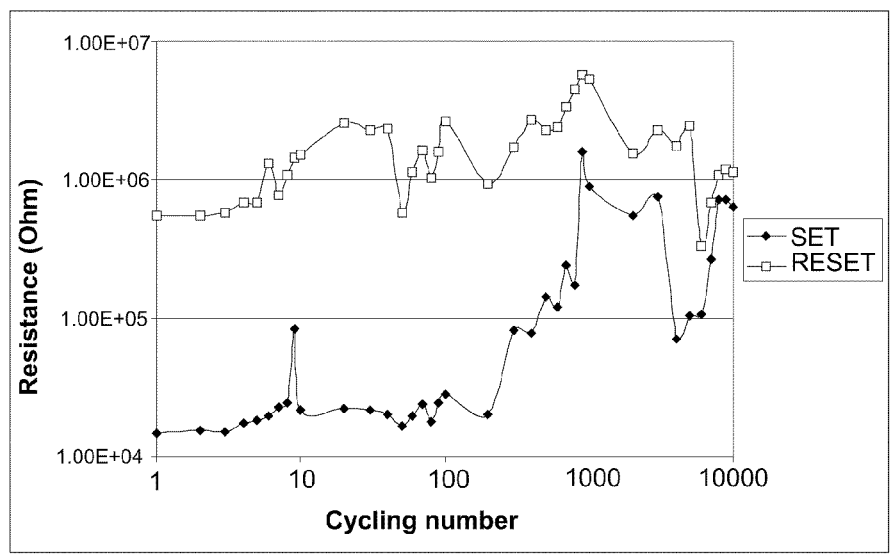
FIG. 8B is measured results of a cycle endurance test using the set operation of FIG. 8A to change to the lower resistance state.

FIG. 8B is measured results of a cycle endurance test using the set pulses of FIG. 8A to change to the lower resistance state, and using a reset pulse of 8.5 V with a pulse width of 80 ns to change to the higher resistance reset state. The measurements of FIG. 8B were done on a bridge type memory cell having a width of 45 nm, a thickness of 5 nm, and a length of 70 nm. As can be seen in FIG. 8B, using the set operation the "difficult to set" behavior is overcome and the memory cell is successfully set to the lower resistance state.

The discussion below with respect to FIGS. 9A-9E further emphasizes the use of different polarity voltage pulses of the set operation described herein for overcoming the "difficult to set" behavior.

Figure 9B:
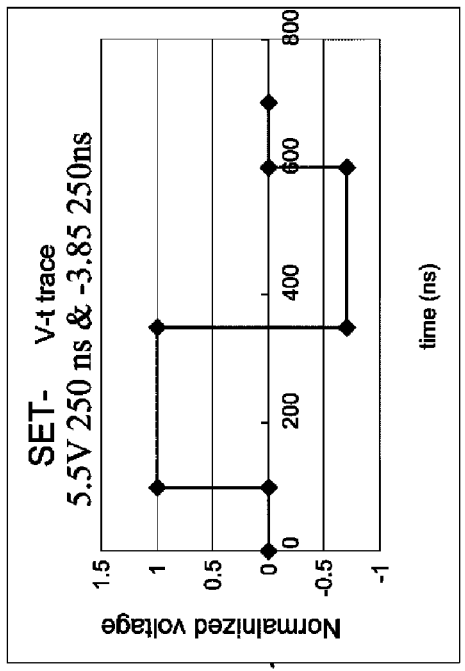
FIG. 9B is a timing diagram of block 910 of the operational sequence of FIG. 9A.
Figure 9C:
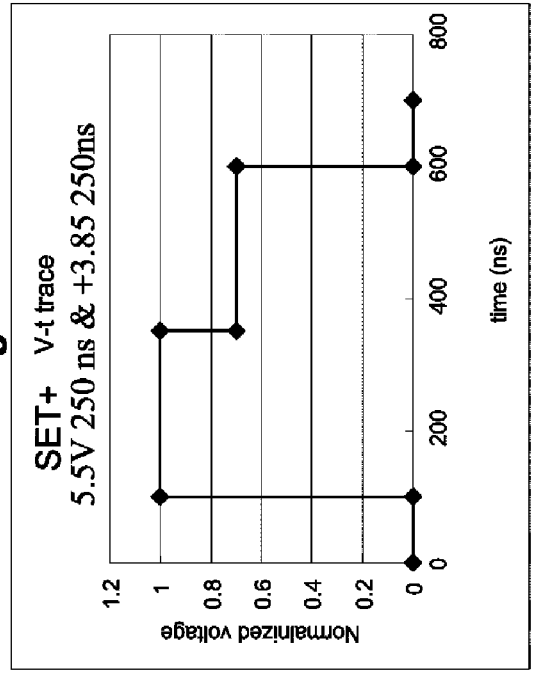
FIG. 9C is a timing diagram of block 930 of the operational sequence of FIG. 9A.
Figure 9A:
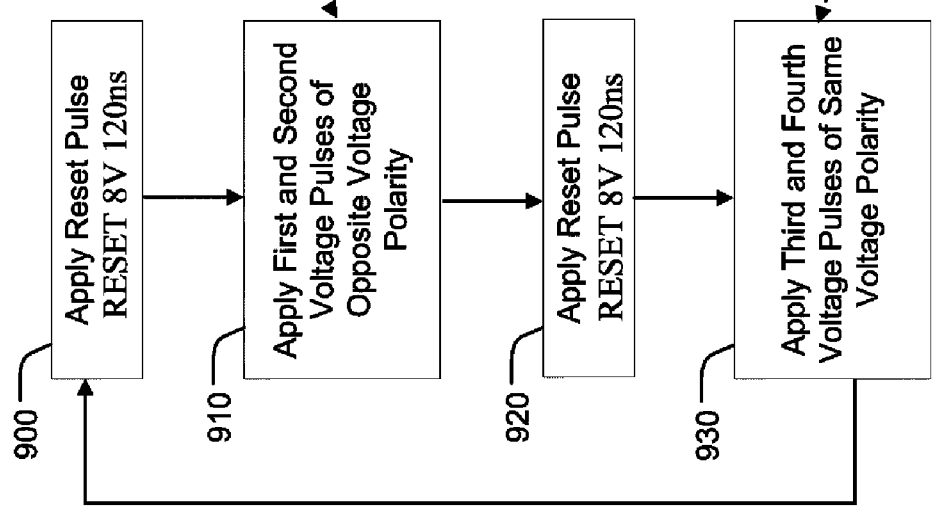
FIG. 9A is a flow diagram of an operational sequence applied to a bridge type memory cell.

FIG. 9A is flow diagram of an operational sequence applied to a bridge type memory cell comprising $Ge_2Sb_2Te_5$ doped with about 8 at % silicon dioxide and having a width of 45 nm, a thickness of 5 nm, and a length of 50 nm. The sequence begins at block 900 by applying a reset pulse of 8V having a pulse width of 120 ns and rise and fall times of about 2.5 ns.

Next, first and second voltage pulses of different voltage polarity across the memory element are applied at block 910. As represented by the simplified timing diagram of FIG. 9B, at block 910 the first voltage pulse has a pulse height of 5.5V and a pulse width of 250 ns and the second voltage pulse has a pulse height of 3.85 V and a pulse width of 250 ns.

Next, the reset pulse of 8V with a pulse width of 120 ns is applied at block 920. Next, third and fourth voltage pulses of the same voltage polarity across the memory element are applied at block 930. As represented by the simplified timing diagram of FIG. 9C, at block 930 the third voltage pulse has a pulse height of 5.5V and a pulse width of 250 ns and the fourth voltage pulse has a pulse height of 3.85 V and a pulse width of 250 ns. The sequence then returns back to block 900.

Figure 9D:
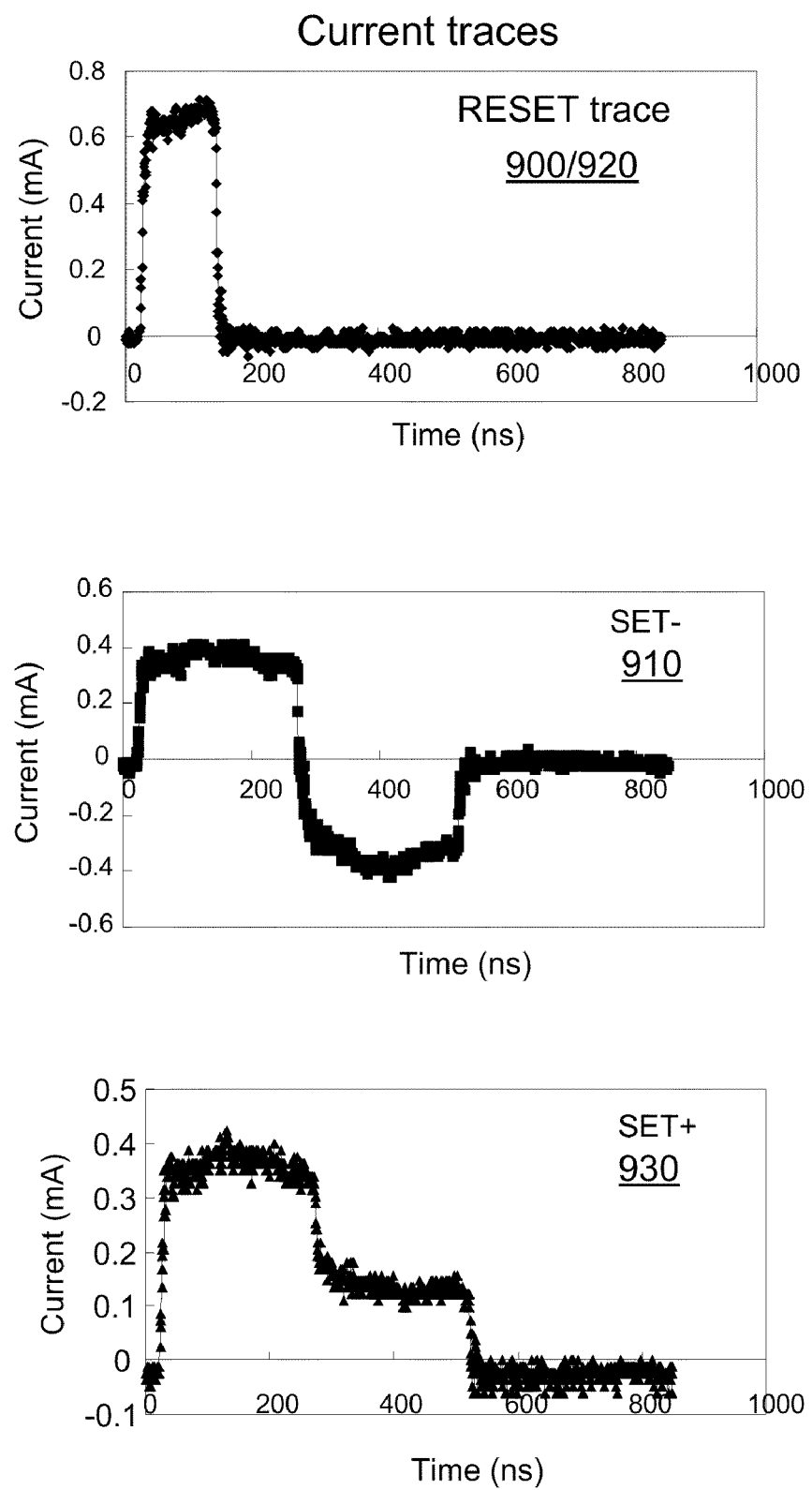
FIG. 9D is the measured current through the memory element for the various blocks of the sequence of FIG. 9A.

FIG. 9D is the measured current through the memory element for the various blocks of sequence of FIG. 9A.

Figure 9E:
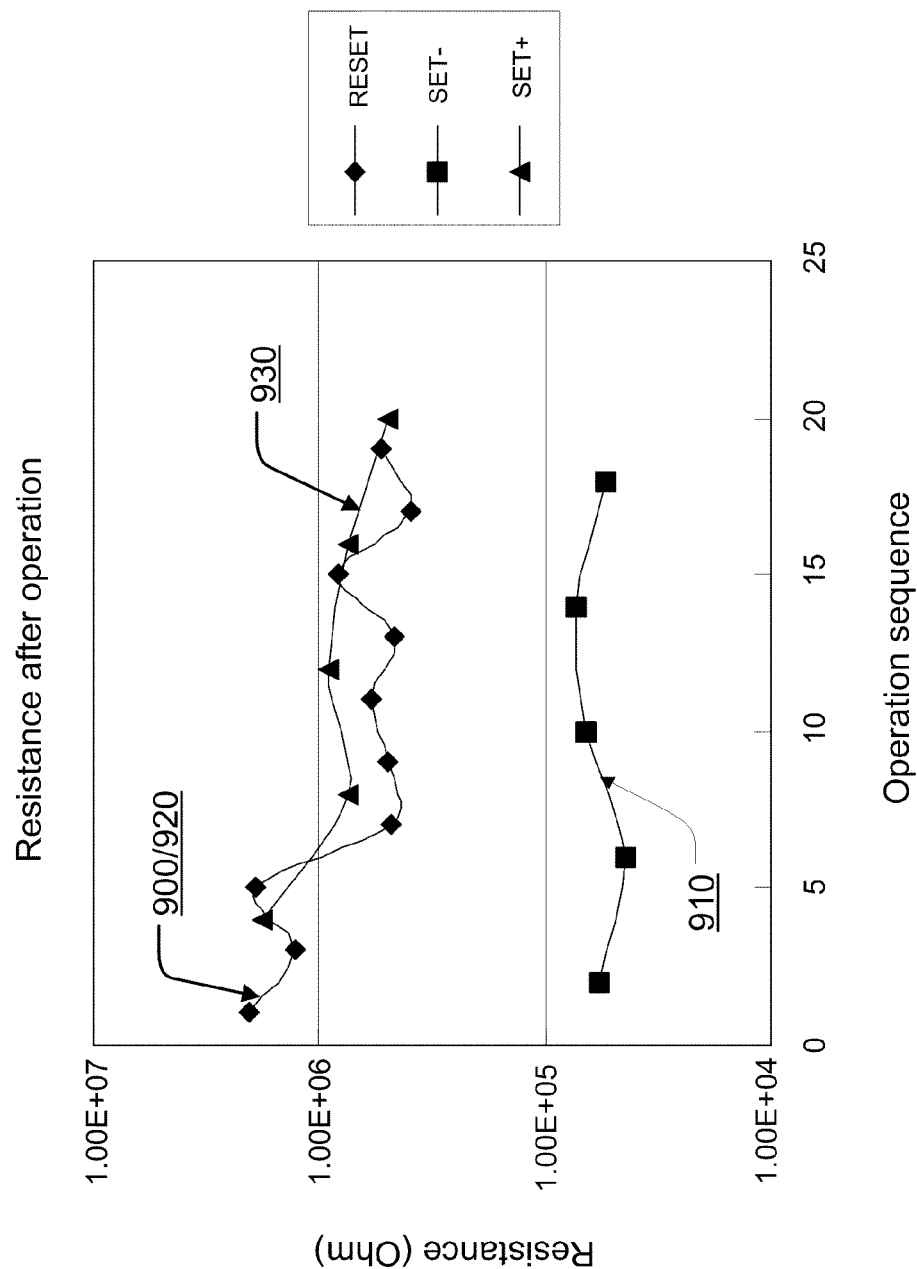
FIG. 9E is the measured resistance of the memory element after each of the operations of the sequence of FIG. 9A.

FIG. 9E is the measured resistance of the memory element after each of the operations of the sequence of FIG. 9A. As can be seen in the data of FIG. 9E, the set operation of step 910 of using voltage pulses of different polarity can successfully set the memory cell while the operation of step 930 is unsuccessful in setting the device.

Figure 10:
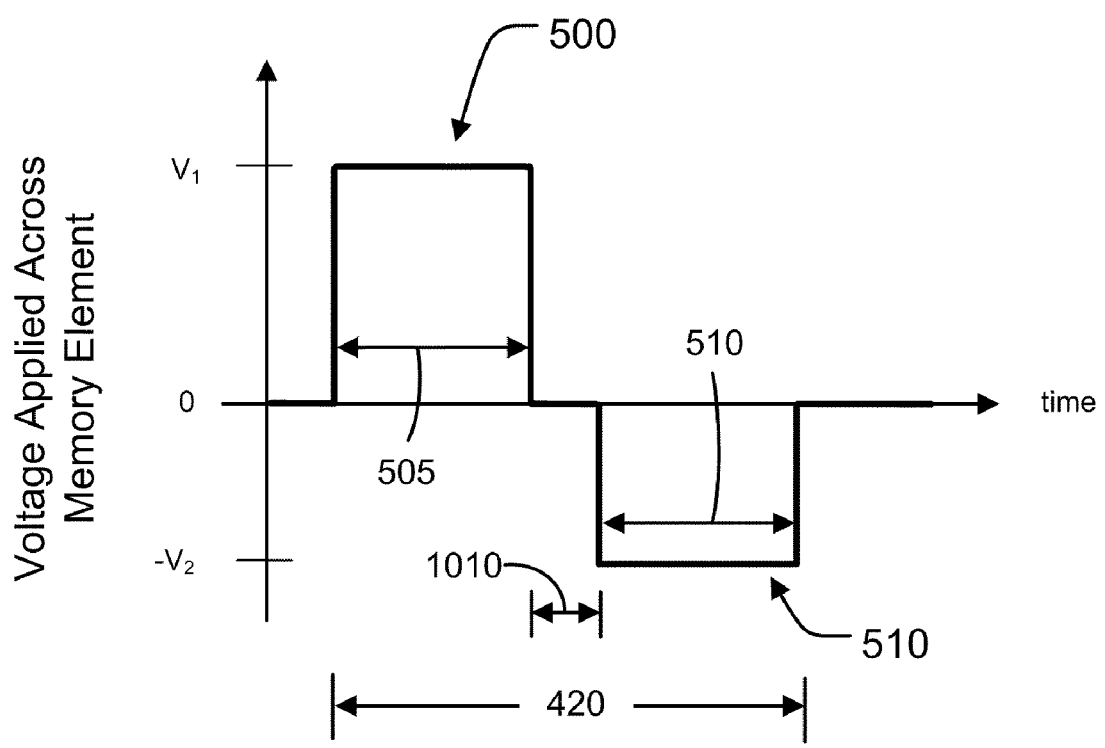
FIG. 10 is a second embodiment of a timing diagram of the set operation of FIG. 4.

In the timing diagram of embodiment of FIG. 5 the trailing edge of the first voltage pulse 500 ends at the same time 550 that the leading edge of the second voltage pulse 510 begins. In embodiments, the leading edge of the second voltage pulse 510 can be aligned with the trailing edge of the first voltage pulse within a small time such as less than 5 ns. FIG. 10 illustrates a second timing diagram of the set operation 400 of FIG. 4 in which the first and second voltage pulses 500, 510 have a spacing (or gap) 1010 therebetween. A maximum value for the spacing 1010 can be determined empirically for each embodiment, as discussed in more detail below with respect to FIGS. 12A-12C.

Figure 11B:
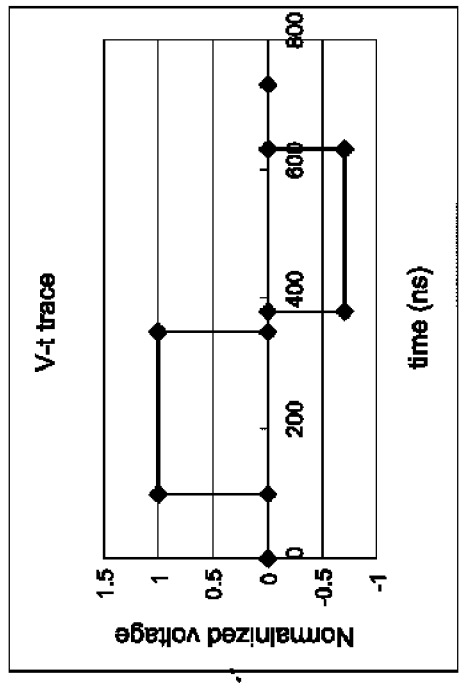
FIG. 11B is a timing diagram of block 1110 of the operational sequence of FIG. 11A.
Figure 11C:
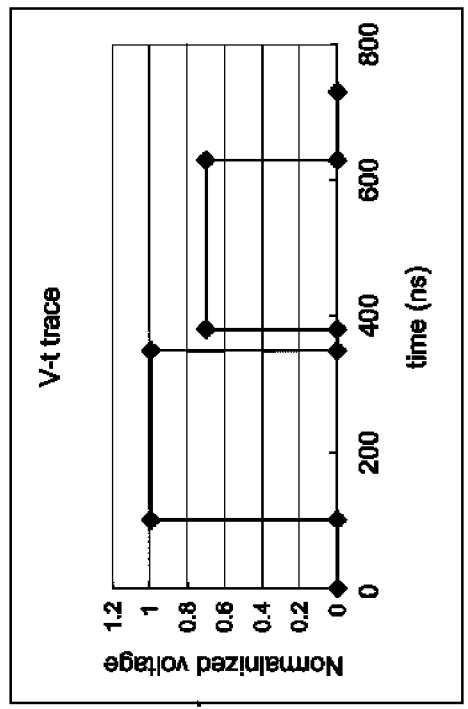
FIG. 11C is a timing diagram of block 1130 of the operational sequence of FIG. 11A.
Figure 11A:
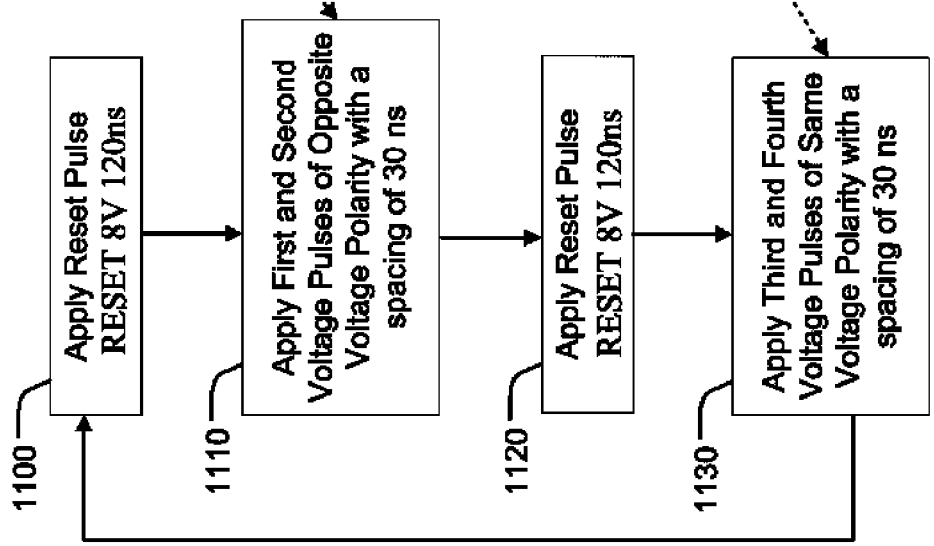
FIG. 11A is a flow diagram of an operation sequence applied to a bridge type memory cell.

FIG. 11A is flow diagram of an operational sequence applied to a bridge type memory cell comprising $Ge_2Sb_2Te_5$ doped with about 8 at % silicon dioxide having a width of 45 nm, a thickness of 5 nm, and a length of 50 nm.

The sequence begins at block 1100 by applying a reset pulse of 8V having a pulse width of 120 ns.

Next, first and second voltage pulses of different voltage polarity across the memory element are applied with a spacing of 30 ns at block 1110. As represented by the simplified timing diagram of FIG. 11B, at block 1110 the first voltage pulse has a pulse height of 5.5V and a pulse width of 250 ns and the second voltage pulse has a pulse height of 3.85 V and a pulse width of 250 ns.

Next, the reset pulse of 8V with a pulse width of 120 ns is applied at block 1120. Next, third and fourth voltage pulses of the same voltage polarity across the memory element are applied with a spacing of 30 ns at block 1130. As represented by the simplified timing diagram of FIG. 11C, at block 1130 the third voltage pulse has a pulse height of 5.5V and a pulse width of 250 ns and the fourth voltage pulse has a pulse height of 3.85 V and a pulse width of 250 ns. The sequence then returns to block 1100.

Figure 11D:
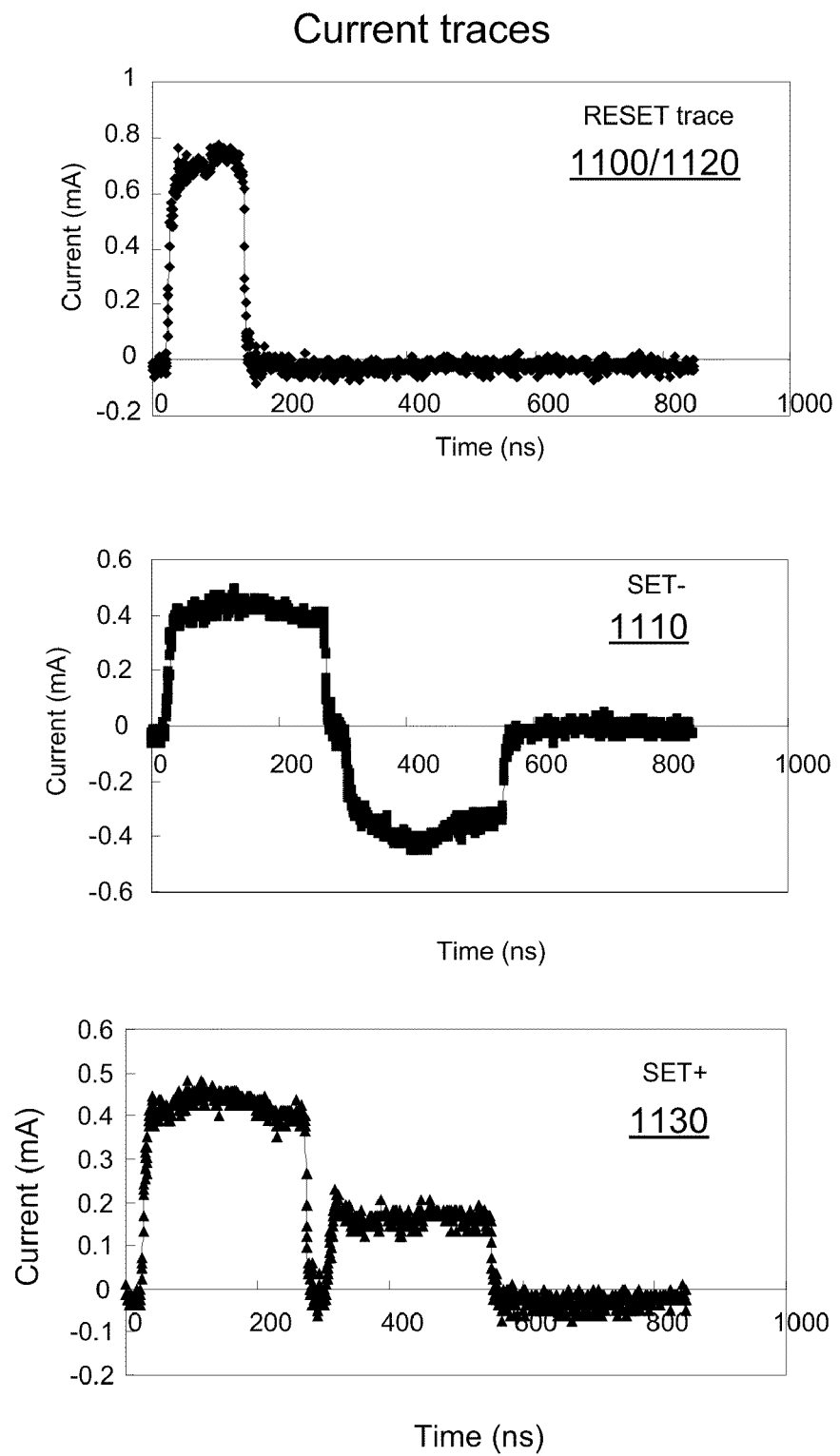
FIG. 11D is the measured current through the memory element for the various blocks of the sequence of FIG. 11A.

FIG. 11D illustrates the measured current through the memory element for the various blocks of the sequence of FIG. 11A.

Figure 11E:
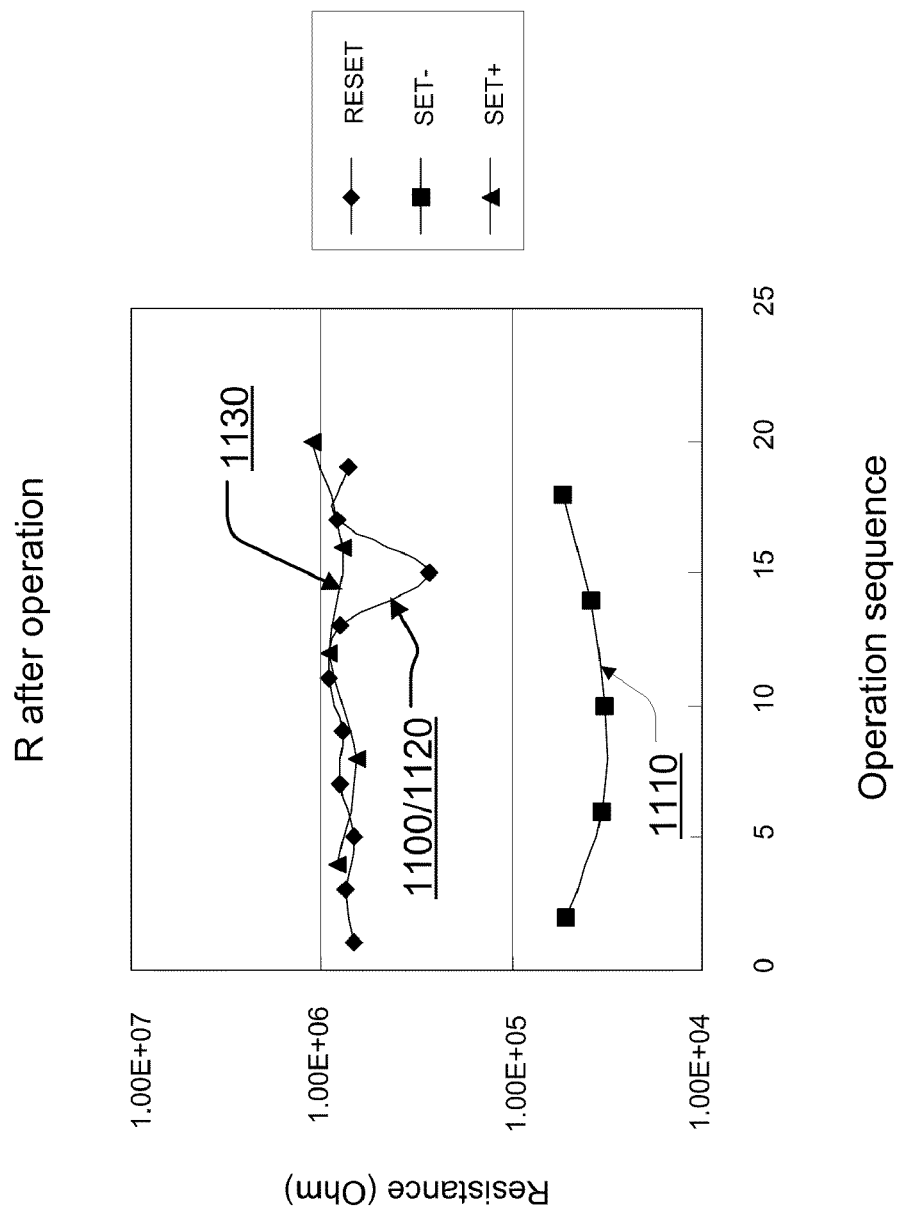
FIG. 11E is the measured resistance of the memory element after each of the operations of the sequence of FIG. 11A.

FIG. 11E is the measured resistance of the memory cell after each of the operations of the sequence of FIG. 11A. As can be seen in the data of FIG. 11E, the set operation of step 1110 of using voltage pulses of different polarity with a pulse width of 30 ns can successfully set the memory cell while the operation of step 1130 is not unsuccessful in setting the device.

Figure 12A:
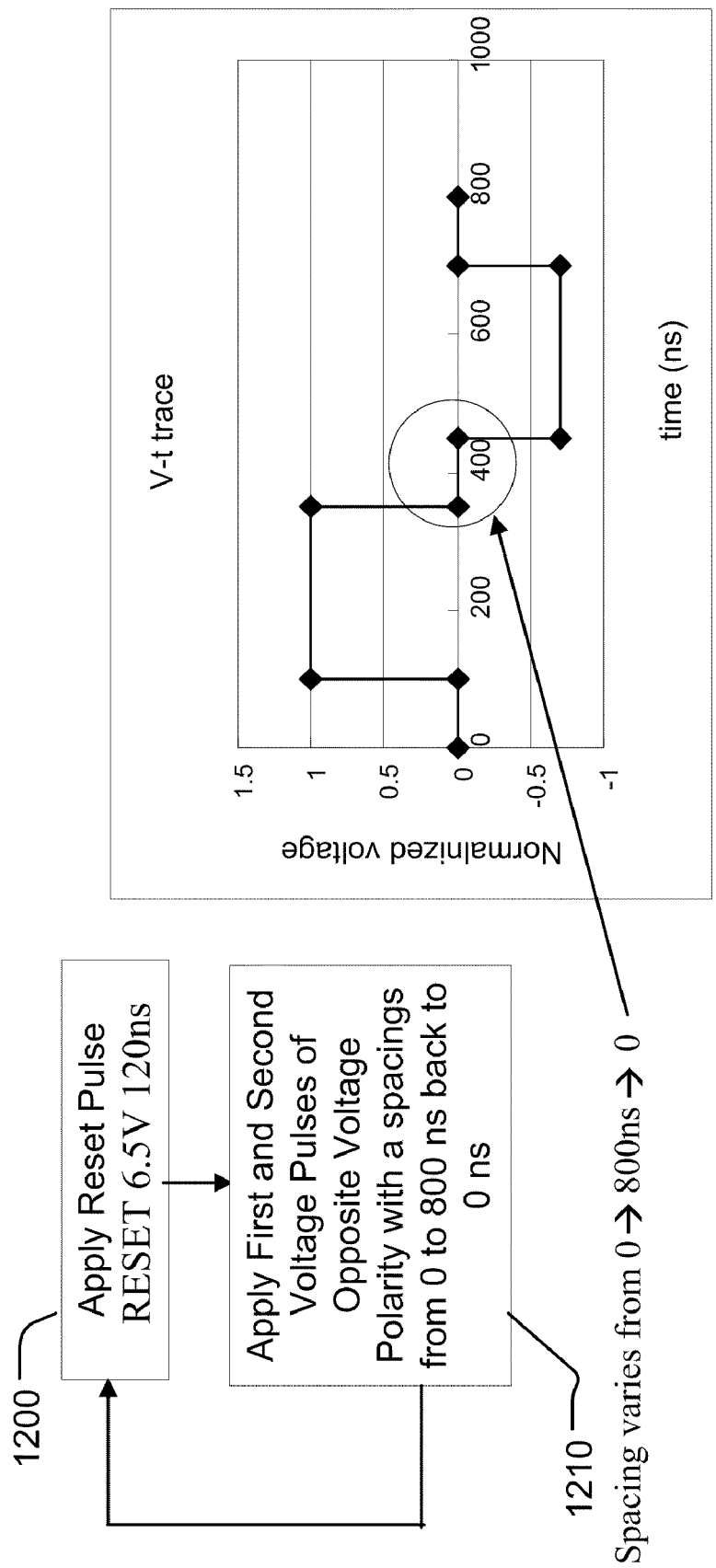
FIG. 12A is a flow diagram of an operational sequence applied to a bridge type memory cell which can be used to determine a maximum acceptable spacing between the first and second voltage pulses of the timing diagram of FIG. 10.

FIG. 12A is a flow diagram of an operational sequence applied to a bridge type memory cell which can be used to determine a maximum acceptable value for the spacing 1010 of the timing diagram of FIG. 10. In the measured results of FIGS. 12B and 12C the bridge type memory cell comprises $Ge_2Sb_2Te_5$ doped with about 8 at % silicon dioxide having a width of 45 nm, a thickness of 5 nm, and a length of 50 nm.

At block 1200 a reset pulse of 6.5V having a pulse width of 120 ns is applied. Next, at block 1210 a first voltage pulse having a pulse height of 5.5V and a pulse width of 250 ns and a second voltage pulse having a pulse height of 3.85 V and a pulse width of 250 ns are applied. The spacing between the first and second voltage pulses begins at 0 ns for the first application of block 1200 and is stepped up for each successive operation of block 1210 to a maximum spacing of 800 ns.

Once the spacing reaches 800 ns, the spacing is stepped down for each successive operation of block 1210 back to 0 ns.

Figure 12B:
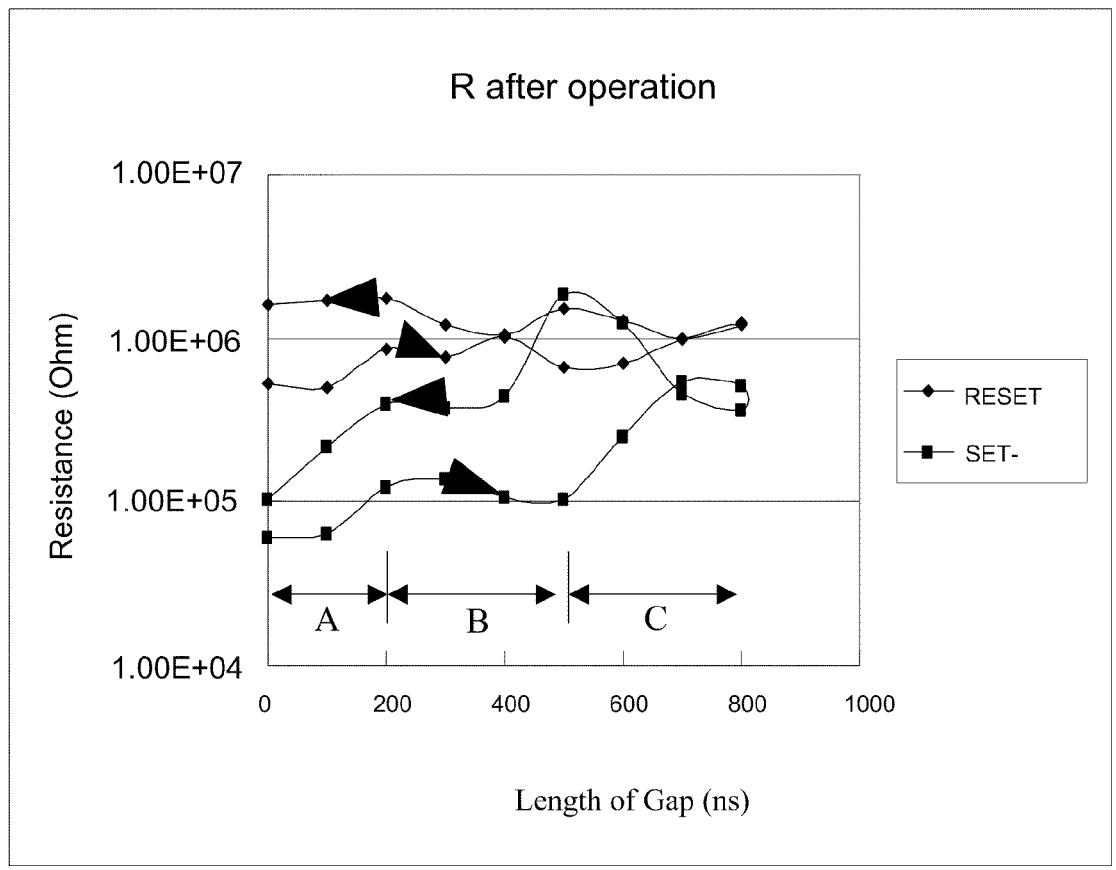
FIG. 12B is the measured resistance of the memory cell after each of the operations of the sequence of FIG. 12A.

FIG. 12B is the measured resistance of the memory cell after each of the operations of the sequence of FIG. 12A. In the measured results of FIG. 12B, a spacing of less than 200 ns (range "A" in the Figure) results in an ability to sufficiently set the device. A spacing of between 200 ns and 500 ns (range "B" in the Figure) results in a moderate ability to set of the device, while a spacing of greater than 500 ns (range "C" in the Figure) is insufficient to set the device. In FIG. 12B the maximum spacing of 500 ns, and preferably less than or equal to 200 ns, suggests that the residual effect is not a parasitic capacitance effect since a parasitic capacitance effect is expected to settle down within a few ns.

The maximum spacing between the voltage pulses that is sufficient for setting is referred to herein as a "settling time". The settling time is the time in which transient residual effects within the phase change material caused by the first voltage pulse have an effect on the phase transition caused by the second voltage pulse. These residual effects may include, for example, changes in temperature and/or free carrier concentration within the phase change material. The settling time will vary from embodiment to embodiment, and can be determined empirically. As explained above, representative settling times are about 500 ns or less.

Figure 12C:
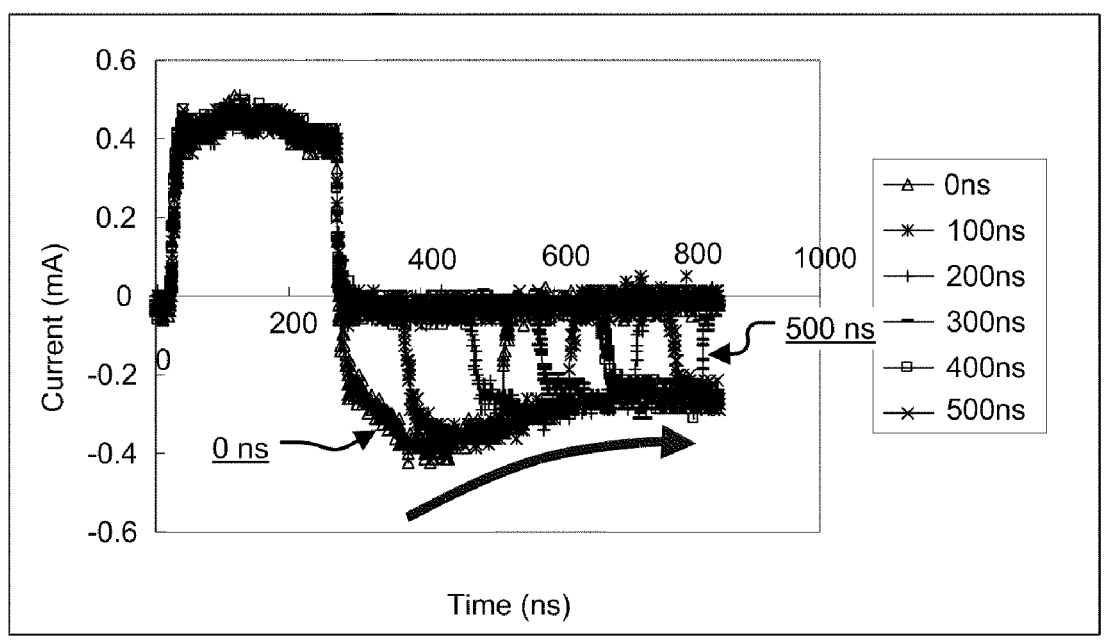
FIG. 12C is the measured current through the memory cell for different spacing values.

FIG. 12C is the measured current through the memory cell for different spacing values between the first and second voltage pulses. As can be seen in FIG. 12C, the amount of current induced by the second voltage pulse is reduced as the spacing between the pulses is increased. This suggests that one transient residual effect of the first pulse may be related to transient free charge carriers that are activated within the phase change material by the first voltage pulse, and which settle down with time (typically in hundreds of ns) during the set operation. It is theorized that the first voltage pulse temporarily increases the concentration of free charge carriers within the phase change material, and the increased free charge carrier concentration during the second voltage pulse results in a current sufficient to induce the phase transition to the lower resistance state. As the spacing between the voltage pulses increases, the number of activated free charge carriers within the phase change material decreases.

Given a memory element having an initial threshold voltage, the activated free charge carriers due to the first voltage pulse can, for example, cause a temporary reduction in the threshold voltage of the memory element. As the spacing between the voltage pulses increases, the activated free charge carriers will decrease, and the threshold voltage will begin to increase back to the original threshold voltage. This temporary reduction in the threshold voltage enables the use of second voltage pulses having a pulse height less than the initial threshold voltage of the memory element so long as the second voltage pulse begins soon enough to take advantage of the transient residual effect of the first pulse. For example, a memory element having a threshold voltage that is less than 70% of the original threshold voltage can be set to the lower resistance state using a second voltage pulse having a pulse height of 70% or more of the original threshold voltage.

The set operations described herein comprising first and second voltage pulses of different polarity have been demonstrated to overcome the "difficult to set" behavior of small bridge type memory cells. However, the set operations may be extended to other types of memory cell structures such as those which suffer significant thermo-electric effects causing asymmetrical heating in the body of the phase change material. Representative configurations suffering this "difficult to set" behavior have a relatively long current path through the phase change material and a cross-sectional area that is small relative to the current path length. Representative configurations also have an active region with a heating zone during a set operation which is spaced away from electrodes contacting the phase change material.

Bridge cells having a thickness between about 3 and 20 nm and pillar cells having diameters between about 3 nm and 20 nm are typical structures to which the set operation described herein can be applied. In particular, these "difficult to set" memory cells include phase change materials such as $Ge_xSb_yTe_z$ and $Ge_xTe_y$ which transition to the set state in a nucleation dominated mode in which crystallization is initiated from numerous locations within the material.

FIG. 13 is a simplified block diagram of an integrated circuit 1300 in which the set operations overcoming "the difficult to set" behavior as described herein can be implemented. The integrated circuit 1300 includes a memory array 1305 of memory cells having phase change memory elements programmable to a plurality of resistance states including a lower resistance state and a higher resistance state. A word line decoder 1310 having read, reset, reset verify, set verify, and set using first and second voltage pulses of different polarity modes is coupled to and in electrical communication with a plurality of word lines 1315 arranged along rows in the memory array 1305. A bit line (column) decoder 1320 is in electrical communication with a plurality of bit lines 1325 arranged along columns in the array 1305 for reading and programming the memory cells (not shown) in array 1305.

Addresses are supplied on bus 1360 to word line decoder and drivers 1310 and bit line decoder 1320. Sense circuitry (Sense amplifiers) and data-in structures in block 1330, including voltage and/or current sources for the read and program modes are coupled to bit line decoder 1320 via data bus 1335. Data is supplied via a data-in line 1340 from input/output ports on integrated circuit 1300, or from other data sources internal or external to integrated circuit 1300, to data-in structures in block 1330. Other circuitry 1365 may be included on integrated circuit 1300, such as a general purpose processor or special purpose application circuitry, or a combination of modules providing system-on-a-chip functionality supported by array 1305. Data is supplied via a data-out line 1345 from the sense amplifiers in block 1330 to input/output ports on integrated circuit 1300, or to other data destinations internal or external to integrated circuit 1300.

The integrated circuit 1310 includes a controller 1350 for read, reset, reset verify, set verify, and set using first and second voltage pulses of different polarity modes of the memory cells of the array 1305. The controller 1350, implemented in this example using a bias arrangement state machine, controls the application of bias circuitry voltage & current sources 1355 for the application of bias arrangements including read, set and reset to the word lines 1315, bit lines 1325, and in some embodiments source lines. Controller 1350 may be implemented using special-purpose logic circuitry as known in the art. In alternative embodiments, controller 1350 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1350.

Figure 14:
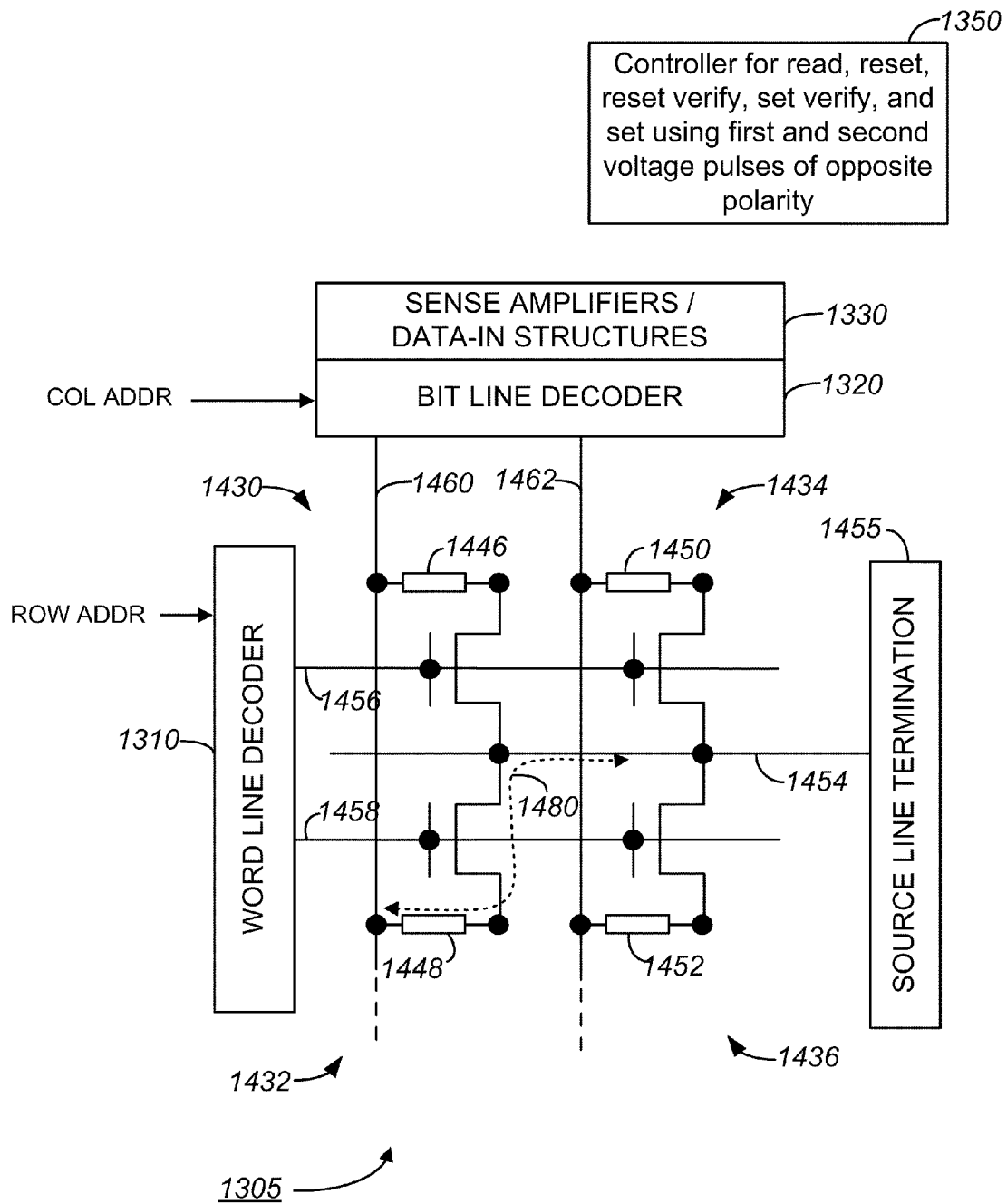
FIG. 14 is a schematic diagram of a portion of the memory array of the integrated circuit of FIG. 13.

As shown in FIG. 14, each of the memory cells of array 1305 includes an access transistor (or other access device such as a diode) and a phase change memory element. In FIG. 14 four memory cells 1430, 1432, 1434, 1436 having respective memory elements 1440, 1442, 1444, 1446 are illustrated, representing a small section of an array that can include millions of memory cells. The memory elements are programmable to a plurality of resistance states including a lower and a higher resistance state.

Sources of each of the access transistors of memory cells 1430, 1432, 1434, 1436 are connected in common to source line 1454 that terminates in source line termination circuit 1455, such as a ground terminal. In another embodiment the source lines of the access devices are not electrically connected, but independently controllable. The source line termination circuit 1455 may include bias circuitry such as voltage sources and current sources, and decoding circuits for applying bias arrangements, other than ground, to the source line 1454 in some embodiments.

A plurality of word lines including word lines 1456, 1458 extend in parallel along a first direction. Word lines 1456, 1458 are in electrical communication with word line decoder 1310. The gates of access transistors of memory cells 1430 and 1434 are connected to word line 1456, and the gates of access transistors of memory cells 1432 and 1436 are connected in common to word line 1458.

A plurality of bit lines including bit lines 1460, 1462 extend in parallel in a second direction and are in electrical communication with bit line decoder 1318. In the illustrated embodiment each of the memory elements are arranged between the drain of the corresponding access device and the corresponding bit line. Alternatively, the memory elements may be on the source side of the corresponding access device.

It will be understood that the memory array 1305 is not limited to the array configuration illustrated in FIG. 14, and additional array configurations can also be used. Additionally, instead of MOS transistors, bipolar transistors may be used as access devices in some embodiments.

In operation each of the memory cells in the array 1305 store data depending upon the resistance of the corresponding memory element. The data value may be determined, for example, by comparison of current on a bit line for a selected memory cell to that of a suitable reference current by sense amplifiers of sense circuitry 1324. The reference current can be established to that a predetermined range of currents correspond to a logical "0", and a differing range of currents correspond to a logical "1". In a memory cell having three or more states, reference currents can be established so that differing ranges of bit line currents correspond to each of the three or more states.

Reading, or writing to a memory cell of array 1312 can be achieved by applying a suitable voltage to one of word lines 1456, 1458 and coupling one of bit lines 1460, 1462 to a voltage so that current flows through the selected memory cell. For example, a current path 1480 through a selected memory cell (in this example memory cell 1432 and corresponding memory element 1448) is established by applying voltages to the bit line 1460, word line 1458, and source line 1454 sufficient to turn on the access transistor of memory cell 1432 and induce current in path 1480 to flow from the bit line 1460 to the source line 1454, or vice-versa. The level and duration of the voltages applied is dependent upon the operation performed.

In a reset (or erase) operation of memory cell 1432, word line decoder 1310 facilitates providing word line 1458 with a suitable voltage to turn on the access transistor of the memory cell 1432. Bit line decoder 1320 facilitates supplying one or more voltage pulses to bit line 1460 of suitable amplitude and duration to induce a current to flow though memory element 1448, thereby raising the temperature of at least the active region above the transition temperature of the phase change material of the memory element 1448 and also above the melting temperature to place at least the active region in a liquid state. The current is then terminated, for example by terminating the voltage pulse on the bit line 1460 and the voltage on the word line 1458, resulting in a relatively quick quenching time as the active region rapidly cools to stabilize to an amorphous phase.

In a read (or sense) operation of memory cell 1432, word line decoder 1310 facilitates providing word line 1458 with a suitable voltage to turn on the access transistor of the memory cell 1432. Bit line decoder 1320 facilitates supplying a voltage to bit line 1460 of suitable amplitude and duration to induce current to flow that does not result in the memory element 1448 undergoing a change in resistive state. The current on the bit line 1460 and through the memory element 548 is dependent upon the resistance of, and therefore the data state associated with, the memory element 1448 of the memory cell 1432. Thus, the data state of the memory cell may be determined, for example by comparison of the current on bit line 1460 with a suitable reference current by sense amplifiers of sense circuitry 1330.

In a set operation of a data value to be stored in the memory cell 1430, bias circuitry (See, for example bias circuitry voltage & current sources 1355 of FIG. 13) coupled to the array 1314 applies a set bias arrangement as described herein comprising one or more pulses to the bit line 1460 and/or word line 1456 and/or source line 1454 to induce current in path 1480. The resultant first and second voltage pulses of different polarity across the memory element 1448 change the resistance state of the memory element 1448 from the higher resistance state to the lower resistance state.

Embodiments of the memory cells described herein include phase change based memory materials, including chalcogenide based materials and other materials, for the memory elements. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

An exemplary method for forming chalcogenide material uses chemical vapor deposition CVD such as that disclosed in US Publication No 2006/0172067 entitled "Chemical Vapor Deposition of Chalcogenide Materials", which is incorporated by reference herein.

A post-deposition annealing treatment in a vacuum or in an N2 ambient is optionally performed to improve the crystallized state of chalcogenide material. The annealing temperature typically ranges from 100° C. to 400° C. with an anneal time of less than 30 minutes.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for operating a memory cell comprising a phase change memory element programmable to a plurality of resistance states including a higher resistance state and a lower resistance state, the method comprising:
    applying a bias arrangement to the memory cell to change the resistance state from the higher resistance state to the lower resistance state, the applying the bias arrangement to the memory cell comprising applying a first voltage pulse and a second voltage pulse across the phase change memory element, the second voltage pulse having a voltage polarity different from that of the first voltage pulse.

2. The method of claim 1, wherein the memory cell further comprises first and second electrodes, the phase change memory element electrically coupling the first electrode to the second electrode, and the phase change memory element having an active region spaced away from the first and second electrodes.

3. The method of claim 1, wherein the memory cell further comprises first and second electrodes and a dielectric spacer between the first electrode and the second electrode, the phase change memory element comprising a bridge of phase change material extending across the dielectric spacer to contact the first and second electrodes, the phase change memory element defining an inter-electrode path between the first and second electrodes having a inter-electrode path length defined by a width of the dielectric spacer.

4. The method of claim 3, wherein the phase change memory element has a thickness between 3 and 20 nm.

5. The method of claim 1, wherein the phase change memory element comprises a nucleation dominated phase change material.

6. The method of claim 1, wherein:
    the first and second voltage pulses have respective leading and trailing edges; and
    the leading edge of the second voltage pulse is aligned within 5 ns of the trailing edge of the first voltage pulse.

7. The method of claim 1, wherein the first and second voltage pulses have a spacing less than a settling time for residual effects of the first voltage pulse.

8. The method of claim 1, wherein the first and second voltage pulses have respective pulse heights and pulse widths, the pulse height of the second voltage pulse less than or equal to the pulse height of the first voltage pulse.

9. The method of claim 8, wherein the pulse height of the second voltage pulse is less than a threshold voltage of the phase change memory element.

10. The method of claim 8, wherein a ratio of the pulse height of the second voltage pulse to the pulse height of the first voltage pulse is between 0.5 and 1.

11. The method of claim 1, wherein the first and second voltage pulses have a spacing of less than or equal to 200 ns.

12. A memory device comprising:
    a memory cell comprising a phase change memory element programmable to a plurality of resistance states including a higher resistance state and a lower resistance state; and bias circuitry adapted to apply a bias arrangement to the memory cell to change the resistance state from the higher resistance state to the lower resistance state, the bias arrangement comprising a first voltage pulse and a second voltage pulse across the phase change memory element, the second voltage pulse having a voltage polarity different from that of the first voltage pulse.

13. The device of claim 12, wherein the memory cell further comprises first and second electrodes, the phase change memory element electrically coupling the first electrode to the second electrode, and the phase change memory element having an active region spaced away from the first and second electrodes.

14. The device of claim 12, wherein the memory cell further comprises first and second electrodes and a dielectric spacer between the first electrode and the second electrode, the phase change memory element comprising a bridge of phase change material extending across the dielectric spacer to contact the first and second electrodes, the phase change memory element defining an inter-electrode path between the first and second electrodes having a inter-electrode path length defined by a width of the dielectric spacer.

15. The device of claim 14, wherein the phase change memory element has a thickness between 3 and 20 nm.

16. The device of claim 12, wherein the phase change memory element comprises a nucleation dominated phase change material.

17. The device of claim 12, wherein:
the first and second voltage pulses have respective leading and trailing edges; and
the leading edge of the second voltage pulse is aligned within 5 ns of the trailing edge of the first voltage pulse.

18. The device of claim 12, wherein the first and second voltage pulses have a spacing less than a settling time for residual effects of the first voltage pulse.

19. The device of claim 12, wherein the first and second voltage pulses have respective pulse heights and pulse widths, the pulse height of the second voltage pulse less than or equal to the pulse height of the first voltage pulse.

20. The device of claim 19, wherein the pulse height of the second voltage pulse is less than a threshold voltage of the phase change memory element.

21. The device of claim 19, wherein a ratio of the pulse height of the second voltage pulse to the pulse height of the first voltage pulse is between 0.5 and 1.

22. The device of claim 12, wherein the first and second voltage pulses have a spacing of less than or equal to 200 ns.

* * * * *